United States Patent
Baek et al.

(10) Patent No.: US 11,877,474 B2
(45) Date of Patent: Jan. 16, 2024

(54) DISPLAY DEVICE CAPABLE OF PREVENTING EXTERNAL LIGHT REFLECTION

(71) Applicant: Samsung Display Co., Ltd., Yongin-Si (KR)

(72) Inventors: Gyungmin Baek, Yongin-si (KR); Hyuneok Shin, Gwacheon-si (KR); Juhyun Lee, Seongnam-si (KR); Hyunmin Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 40 days.

(21) Appl. No.: 17/167,128

(22) Filed: Feb. 4, 2021

(65) Prior Publication Data

US 2021/0336232 A1    Oct. 28, 2021

(30) Foreign Application Priority Data

Apr. 27, 2020    (KR) .......................... 10-2020-0050822

(51) Int. Cl.
| | |
|---|---|
| H10K 50/86 | (2023.01) |
| H10K 71/00 | (2023.01) |
| H10K 59/35 | (2023.01) |
| H10K 59/122 | (2023.01) |
| H10K 59/124 | (2023.01) |

(52) U.S. Cl.
CPC ........... *H10K 50/865* (2023.02); *H10K 71/00* (2023.02); *H10K 59/122* (2023.02); *H10K 59/124* (2023.02); *H10K 59/35* (2023.02)

(58) Field of Classification Search
CPC . H01L 51/5281; H01L 51/5284; H01L 51/56; H01L 2227/323; G02B 1/11; H10K 50/865; H10K 59/8792; H10K 71/00; H10K 71/40; H10K 71/421; H10K 71/441
USPC .......................................... 257/91
See application file for complete search history.

(56) References Cited

U.S. PATENT DOCUMENTS

| | | | | |
|---|---|---|---|---|
| 2003/0062519 A1* | 4/2003 | Yamazaki | ............ | H10K 50/844 |
| | | | | 257/40 |
| 2011/0019277 A1* | 1/2011 | Sager | ..................... | G02B 1/113 |
| | | | | 427/75 |
| 2013/0343032 A1* | 12/2013 | Lee | ..................... | G02B 5/3083 |
| | | | | 427/163.1 |

(Continued)

FOREIGN PATENT DOCUMENTS

| | | | |
|---|---|---|---|
| EP | 1020738 A1 | 7/2000 | |
| KR | 10-2016-0061537 A | 6/2016 | |

(Continued)

*Primary Examiner* — Matthew E. Gordon
(74) *Attorney, Agent, or Firm* — Innovation Counsel LLP

(57) ABSTRACT

A display device may include a display panel having a first region and a second region having a transmittance lower than a transmittance of the first region, the display panel including a substrate and a pixel layer disposed on the substrate, and an anti-reflection layer disposed on one side of the substrate in an area corresponding to the first region. The anti-reflection layer may include a first anti-reflection pattern including first metal and a second anti-reflection pattern disposed on the first anti-reflection pattern and including molybdenum oxide (MoO$_x$) and oxide of second metal other than molybdenum.

15 Claims, 16 Drawing Sheets

(56) References Cited

U.S. PATENT DOCUMENTS

2015/0255751 A1\* 9/2015 Schwamb ........... H01L 51/5262
                                                257/40
2017/0170199 A1\* 6/2017 Zhang ................... H01L 23/528
2019/0004616 A1\* 1/2019 Baek ..................... H01L 27/323

FOREIGN PATENT DOCUMENTS

| KR | 10-2017-0030314 A | 3/2017 |
| KR | 10-2019-0127717 A | 11/2019 |
| WO | 2018064947 A1 | 4/2018 |

\* cited by examiner

DISPLAY DEVICE CAPABLE OF PREVENTING EXTERNAL LIGHT REFLECTION

CROSS-REFERENCE TO RELATED APPLICATION

This application claims priority under 35 USC § 119 to Korean Patent Application No. 10-2020-0050822 filed on Apr. 27, 2020 in the Korean Intellectual Property Office (KIPO), the entire disclosure of which is incorporated herein by reference.

BACKGROUND

1. Field

Embodiments relate to a display device. More particularly, embodiments relate to a display device for preventing external light reflection and a method of manufacturing the same.

2. Description of the Related Art

A display device may provide visual information to a user by displaying an image. To this end, the display device may include a display panel for converting an electrical signal into an image. The display panel may include a light transmission region through which external light incident to the display device transmits. Through the light transmission region, functional modules such as a camera module and a sensor module disposed on a rear side of the display panel may detect or recognize an object and a user positioned in front of the display panel.

When external light passes through a light transmission region having a relatively small area and is incident onto the functional modules, light interference may occur, and when the interfered external light is reflected by the display panel and/or the functional modules, the user may visually recognize a ghost image or the like in the light transmission region. Accordingly, a method for reducing or substantially preventing the external light reflection in the transmission region is required.

SUMMARY

Embodiments provide a display device in which external light reflection is reduced.

A display device according to one embodiment may include a display panel having a first region and a second region having a transmittance lower than a transmittance of the first region, the display panel including a substrate and a pixel layer disposed on the substrate, and an anti-reflection layer disposed on one side of the substrate in an area corresponding to the first region. The anti-reflection layer may include a first anti-reflection pattern including first metal and a second anti-reflection pattern disposed on the first anti-reflection pattern and including molybdenum oxide ($MoO_x$) and oxide of second metal other than molybdenum.

In one embodiment, the anti-reflection layer may overlap the first region and does not overlap the second region.

In one embodiment, the first metal may include at least one of molybdenum (Mo), aluminum (Al), and titanium (Ti).

In one embodiment, the second metal may include at least one of tantalum (Ta), tungsten (W), niobium (Nb), and copper (Cu).

In one embodiment, a ratio of the second metal to molybdenum in the second anti-reflection pattern may be greater than 0 at % and less than about 20 at %.

In one embodiment, the molybdenum oxide included in the second anti-reflection pattern and the oxide of the second metal may have a crystalline structure.

In one embodiment, the anti-reflection layer may be disposed on a bottom surface of the substrate, and the first anti-reflection pattern may be disposed between the substrate and the second anti-reflection pattern.

In one embodiment, the anti-reflection layer may be disposed on a top surface of the substrate, and the second anti-reflection pattern may be disposed between the substrate and the first anti-reflection pattern.

In one embodiment, the second anti-reflection pattern may have a thickness greater than about 100 Å and smaller than about 1000 Å.

In one embodiment, a side-wall of the anti-reflection layer may be inclined with respect to the substrate.

In one embodiment, the second anti-reflection pattern may have a reflectivity less than a reflectivity of the first anti-reflection pattern.

In one embodiment, the first region may include a first pixel region, a transmission region, and a first peripheral region surrounding the first pixel region and the transmission region.

In one embodiment, the anti-reflection layer may overlap the first pixel region and the first peripheral region and may not overlap the transmission region.

In one embodiment, the second region may include a second pixel region and a second peripheral region surrounding the second pixel region.

In one embodiment, the second region may surround at least a part of the first region.

In one embodiment, the display device may further include a functional module disposed under the display panel in an area corresponding to the first region.

In one embodiment, the functional module may include at least one of a camera module, a face recognition sensor module, a pupil recognition sensor module, an acceleration sensor module, a proximity sensor module, an infrared sensor module, and an illuminance sensor module.

A method of manufacturing a display device according to one embodiment may include forming a first anti-reflection layer including first metal on a substrate having a first region and a second region that has a transmittance lower than the first region, forming a second anti-reflection layer including molybdenum oxide ($MoO_x$) and oxide of second metal other than molybdenum, and forming an anti-reflection layer in an area corresponding to the first region of the display panel by etching the first anti-reflection layer and the second anti-reflection layer through a single etching process using one mask.

In one embodiment, the first anti-reflection layer and the second anti-reflection layer may be etched through a dry etching.

In one embodiment, the method may further include cleaning the substrate including the first anti-reflection layer and the second anti-reflection layer by deionized water, before etching the first anti-reflection layer and the second anti-reflection layer.

The display device according to the embodiments may include the anti-reflection layer disposed on one side of the substrate corresponding to the first region and including the first anti-reflection pattern including first metal and the second anti-reflection pattern including molybdenum oxide ($MoO_x$) and oxide of second metal other than molybdenum so that the reflection of the external light passing through the first region may be reduced or substantially prevented. Accordingly, ghost image due to interference and reflection of the external light in the first region may not be recognized.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Hereinafter, display devices and methods of manufacturing display devices in accordance with embodiments will be explained in detail with reference to the accompanying drawings.

Hereinafter, a display device according to one embodiment will be described with reference to FIGS. 1 to 6.

Figure 1:
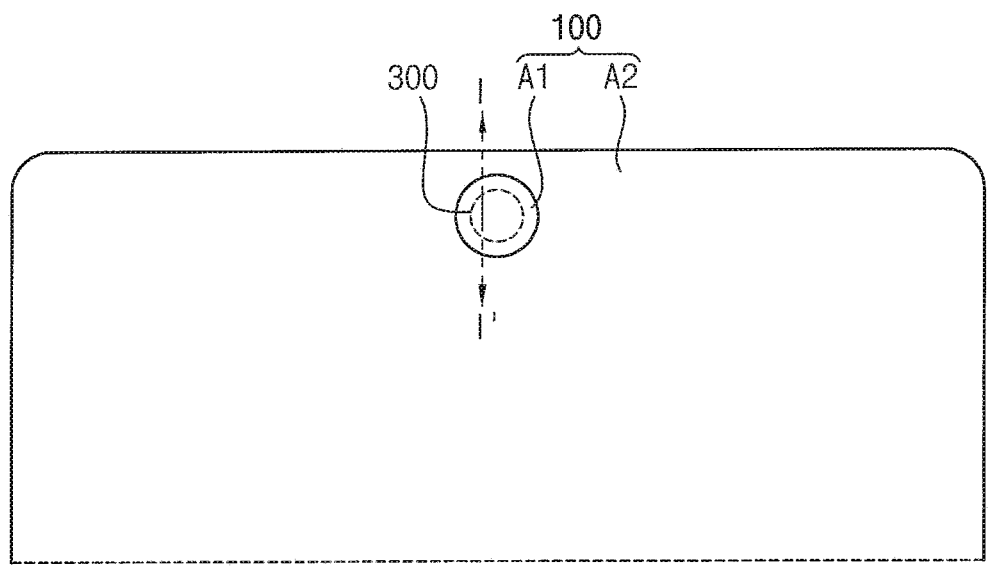
FIG. 1 is a plan view showing a part of a display device according to one embodiment of the present inventive concept.
Figure 2:
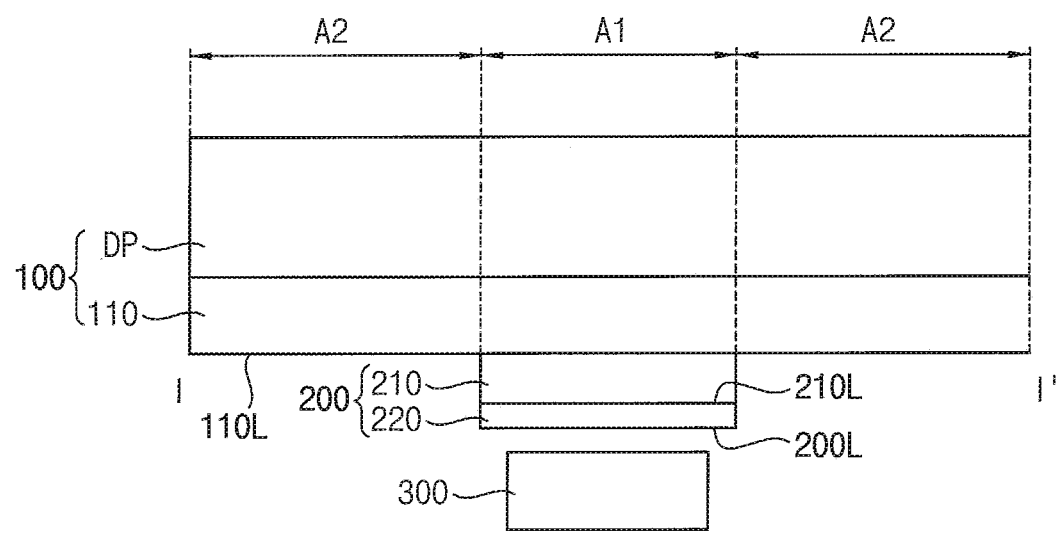
FIG. 2 is a sectional view showing one example taken along line I-I' of FIG. 1.

FIG. 1 is a plan view showing a part of the display device according to one embodiment of the present inventive concept. FIG. 2 is a sectional view showing one example taken along line I-I' of FIG. 1.

Referring to FIGS. 1 and 2, the display device may include a display panel 100, an anti-reflection layer 200, and a functional module 300.

The display panel 100 may have a first region A1 and a second region A2. Each of the first region A1 and the second region A2 may be a display region for displaying an image. The first region A1 may include a transmission region for allowing external light to be transmitted therethrough. When the first region A1 includes the transmission region, the transmittance of the first region A1 may be higher than the transmittance of the second region A2. In other words, the transmittance of the second region A2 may be lower than the transmittance of the first region A1. The first region A1 may allow the external light to be transmitted therethrough while displaying the image.

The first region A1 and the second region A2 may be disposed adjacent to each other. In one embodiment, the second region A2 may surround at least a part of the first region A1. For example, the first region A1 may be spaced apart from an edge of the display panel 100 and disposed in the display panel 100 when viewed from the top, and the second region A2 may completely surround the first region A1.

In one embodiment, the first region A1 may have a circular shape when viewed from the top. However, the present inventive concept is not limited thereto. In another embodiment, the first region A1 may have various polygonal shapes when viewed from the top.

The display panel 100 may include a substrate 110 and a pixel layer DP. The pixel layer DP may be disposed on the substrate 110. The pixel layer DP may include pixels for displaying the image.

The anti-reflection layer 200 may be disposed on the bottom surface 110L of the substrate 110 corresponding to the first region A1. The anti-reflection layer 200 may reduce or substantially prevent the external light incident to the first region A1 from being reflected from the bottom surface 110L or interfaces between adjacent layers that form the pixel layer in the first region A1.

In one embodiment, the anti-reflection layer 200 may overlap the first region A1 and may not overlap the second region A2. In other words, the anti-reflection layer 200 may be disposed only on the bottom surface 110L of the substrate 110 corresponding to the first region A1 and may not be disposed on the bottom surface 110L of the substrate 110 corresponding to the second region A2. The first region A1 may completely overlap with the anti-reflection layer 200 in a plan view.

The anti-reflection layer 200 may include a first anti-reflection pattern 210 and a second anti-reflection pattern 220. The second anti-reflection pattern 220 may be disposed on the first anti-reflection pattern 210.

In one embodiment, the first anti-reflection pattern 210 may be disposed between the substrate 110 and the second anti-reflection pattern 220. For example, the first anti-reflection pattern 210 may be disposed on a bottom surface 110L of the substrate 110, and the second anti-reflection pattern 220 may be disposed on a bottom surface 210L of the first anti-reflection pattern 210.

The first anti-reflection pattern 210 may include first metal. The first metal may include at least one of molybdenum (Mo), aluminum (Al), and titanium (Ti). The first anti-reflection pattern 210 may reduce reflection of the external light that is incident through the first region A1.

The second anti-reflection pattern 220 may include molybdenum oxide ($MoO_x$) and oxide of second metal other than molybdenum (Mo). The second metal may include at least one of tantalum (Ta), tungsten (W), niobium (Nb), and copper (Cu). In one embodiment, the second anti-reflection pattern 220 may include molybdenum oxide ($MoO_x$) and tantalum oxide ($TaO_y$). The second anti-reflection pattern 220 may absorb the external light incident through the first region A1, so that the reflection of the external light may be reduced or substantially prevented.

Molybdenum oxide may absorb the external light in the second anti-reflection pattern 220, thereby functioning to reduce the reflectivity of the second anti-reflection pattern 220. When the second anti-reflection pattern 220 includes molybdenum oxide, the second anti-reflection pattern 220 may function as a black matrix.

The oxide of the second metal in the second anti-reflection pattern 220 may serve to prevent a damage to the second anti-reflection pattern 220. In the process of forming the second anti-reflection pattern 220, a process of washing the second anti-reflection pattern 220 by using deionized water (DI water) may be performed. When the second anti-reflection pattern 220 does not include the oxide of the second metal, the molybdenum oxide included in the second anti-reflection pattern 220 may be dissolved by the deionized water during the washing process, so that the second anti-reflection pattern 220 may be damaged. However, when the second anti-reflection pattern 220 includes the oxide of the second metal, the second anti-reflection pattern 220 may not be dissolved by the deionized water, and the damage to the second anti-reflection pattern 220 during the washing process may be prevented.

In one embodiment, the ratio of the second metal to molybdenum (Mo) in the second anti-reflection pattern 220 may be greater than 0 at % and less than about 20 at %. When the ratio of the second metal to molybdenum (Mo) in the second anti-reflection pattern 220 is 0 at %, the second anti-reflection pattern 220 may be damaged in the process of the washing the second anti-reflection pattern 220 as described above. When the ratio of the second metal to molybdenum (Mo) in the second anti-reflection pattern 220 is greater than about 20 at %, the reflectivity of the second anti-reflection pattern 220 may exceed a predetermined reflectivity (for example, about 20%). In addition, when the ratio of the second metal to molybdenum (Mo) in the second anti-reflection pattern 220 is greater than about 20 at %, the etching properties of the second anti-reflection pattern 220 may be deteriorated.

The reflectivity of the second anti-reflection pattern 220 may be smaller than the reflectivity of the first anti-reflection pattern 210. When the anti-reflection layer 200 includes only the first anti-reflection pattern 210, the anti-reflection layer 200 may not sufficiently reduce the reflection of the external light incident through the first region A1. However, when the second anti-reflection layer 220 having the reflectivity smaller than that of the first anti-reflection pattern 210 is disposed on the first anti-reflection pattern 210, the reflection of the external light incident through the first region A1 may be sufficiently reduced or substantially prevented.

The functional module 300 may be disposed under the display panel 100 in an area corresponding to the first region A1. In one embodiment, the functional module 300 may be disposed on the bottom surface 200L of the anti-reflection layer 200 in an area corresponding to the first region A1. The functional module 300 may receive the external light passing through the first region A1.

In one embodiment, the functional module 300 may include a camera module configured to photograph (or recognize) an image of the object positioned in front of the display device, a face recognition sensor module configured to sense a face of a user, a pupil recognition sensor module configured to sense a pupil of the user, an acceleration sensor module and a geomagnetic sensor module configured to determine a movement of the display device, a proximity sensor module and an infrared sensor module configured to detect a proximity to a front of the display device, and an illuminance sensor module configured to measure an external brightness.

When the external light passes through the first region A1 having a relatively small area a light interference may occur, and when the interfered external light is reflected by the display panel 100 and/or the functional module 300, the user may visually recognize a ghost image or the like displayed in the first region A1. However, the display device according to one embodiment of the present inventive concept includes the anti-reflection layer 200 disposed on the bottom surface 110L of the substrate 110 in the area corresponding to the first region A1, and thus the anti-reflection layer 200 may absorb the external light even when the light interference occurs from the external light passing through the first region A1, so that the reflection of the external light may be reduced or substantially prevented. Accordingly, the user may be prevented from visually recognizing the ghost image or the like.

Figure 3:
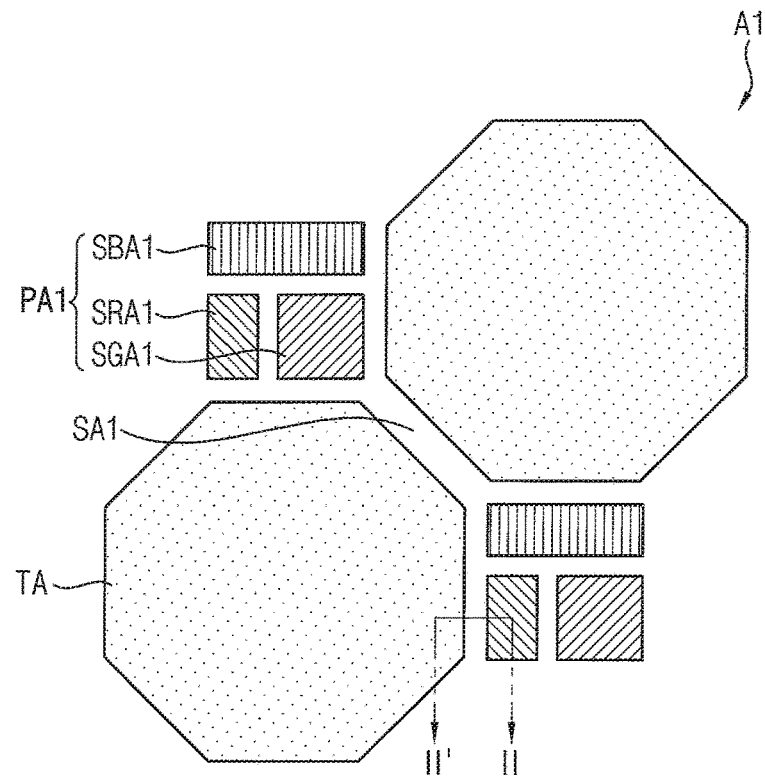
FIG. 3 is a plan view showing a first region of the display device of FIG. 1.
Figure 4:
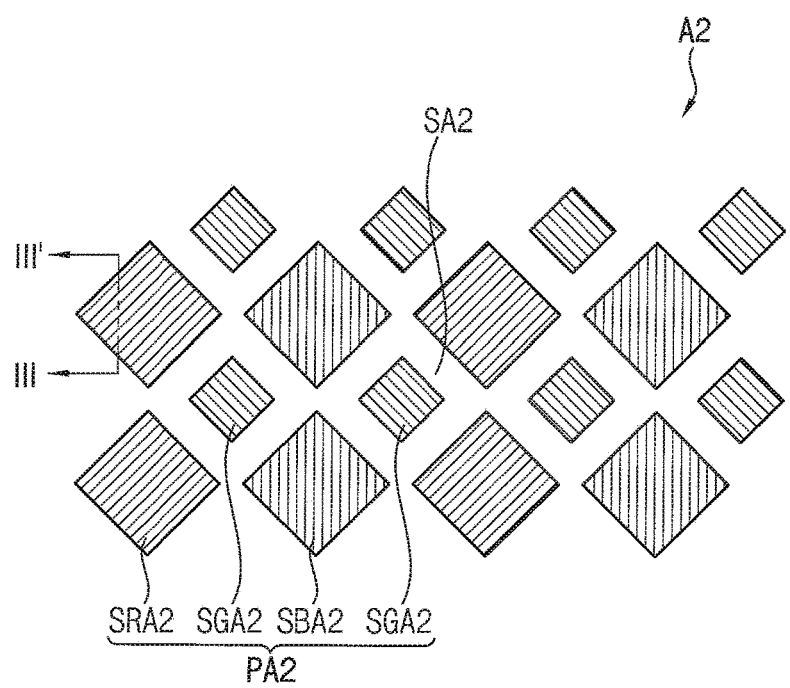
FIG. 4 is a plan view showing a second region of the display device of FIG. 1.

FIG. 3 is a plan view showing the first region A1 of the display device of FIG. 1. FIG. 4 is a plan view showing the second region A2 of the display device of FIG. 1.

Referring to FIGS. 1, 3 and 4, the first region A1 may include a first pixel region PA1, a transmission region TA, and a first peripheral region SA1, and the second region A2 may include a second pixel region PA2 and a second peripheral region SA2. Each of the first pixel region PA1 and the second pixel region PA2 may be a region in which pixels are disposed to emit light generated from each of the pixels thereby displaying an image.

The first pixel region PA1 may include a plurality of first sub-pixel regions SRA1, SGA1, and SBA1 emitting light having mutually different colors, and the second pixel region PA2 may include a plurality of second sub-pixel regions SRA2, SGA2, and SBA2 emitting light having mutually different colors. In one embodiment, the sub-pixel regions SRA1, SGA1, and SBA1 may include a first red pixel region SRA1 emitting red light, a first green pixel region SGA1 emitting green light, and a first blue pixel region SBA1 emitting blue light, and the second sub-pixel regions SRA2, SGA2, and SBA2 may include a second red pixel region SRA2 emitting red light, a second green pixel region SGA2 emitting green light, and a second blue pixel region SBA2 emitting blue light.

The transmission region TA may be a region in which no sub-pixels is disposed and that transmits the external light incident to the display panel 100. When the first region A1 includes the transmission region TA through which the external light is transmitted, the functional module 300 disposed under the display panel 100 in the area corresponding to the first region A1 may easily detect or recognize the object or the user positioned in front of the display device through the transmission region TA. The first peripheral region SA1 may surround the first pixel region PA1 and the transmission region TA. The second peripheral region SA2 may surround the second pixel area PA2. Each of the first peripheral region SA1 and the second peripheral region SA2 may be a region in which light is not emitted and external light is not transmitted.

When the first region A1 includes the transmission region TA, the number of first sub-pixel regions SRA1, SGA1, and SBA1 per unit area may be smaller than the number of second sub-pixel regions SRA2, SGA2, and SBA2 per unit area in the second region A2. In other words, a resolution of the first region A1 may be less than a resolution of the second region A2.

In one embodiment, an arrangement structure of the first sub-pixel regions SRA1, SGA1, and SBA1 the first region A1 may be different from an arrangement structure of the second sub-pixel regions SRA2, SGA2, and SBA2 the second region A2. For example, the first sub-pixel regions SRA1, SGA1, and SBA1 may be arranged in a stripe manner, and the second sub-pixel regions SRA2, SGA2, and SBA2 may be arranged in a PenTile manner. In this case, the first pixel region PA1 may include one first red pixel region SRA1, one first green pixel region SGA1, and one first blue pixel region SBA1, and the second pixel region PA2 may include one second red pixel region SRA2, two second green pixel regions SGA2, and one second blue pixel region SBA2.

Figure 5:
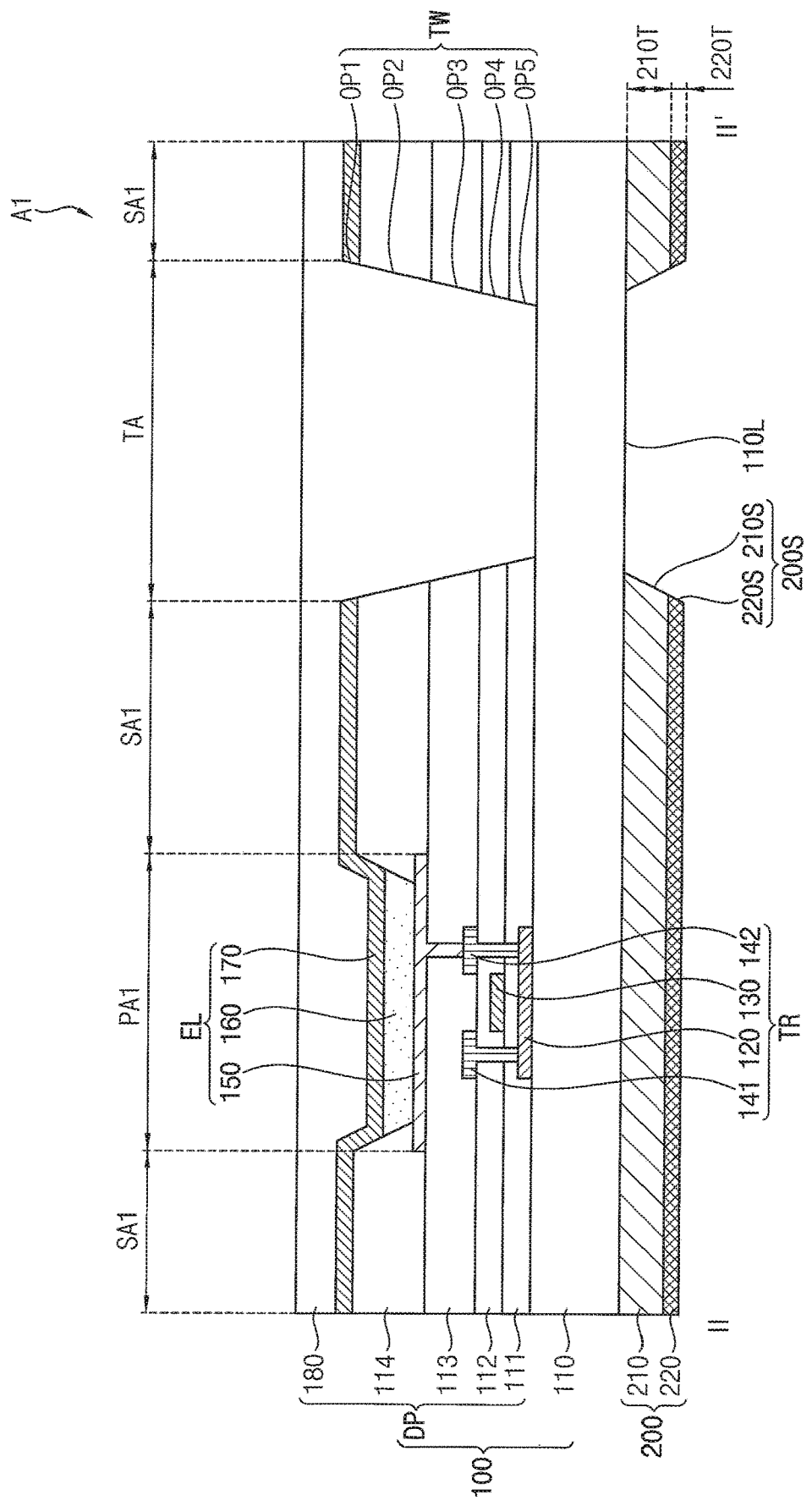
FIG. 5 is a sectional view taken along line II-IT of FIG. 3.
Figure 6:
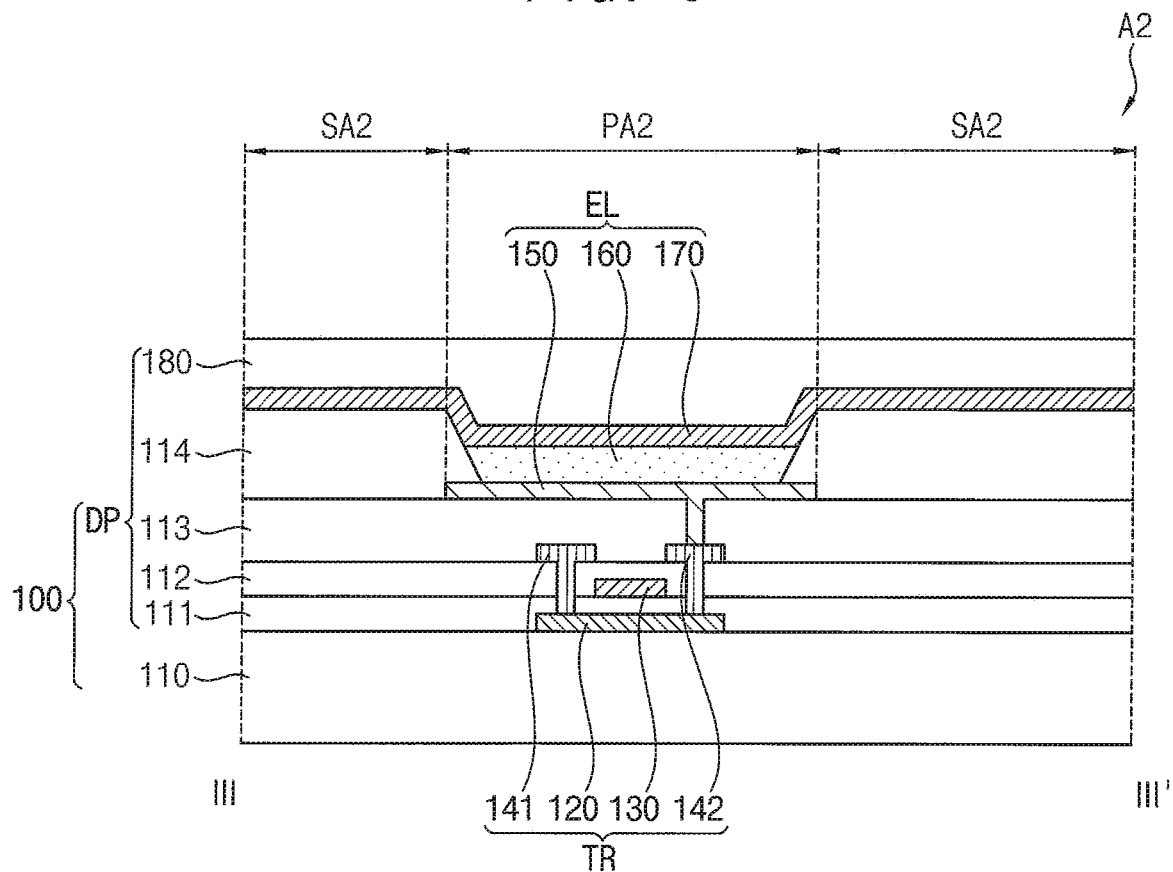
FIG. 6 is a sectional view taken along line III-III' of FIG. 4.

FIG. 5 is a sectional view taken along line II-IT of FIG. 3. FIG. 6 is a sectional view taken along line III-III' of FIG. 4.

Referring to FIGS. 5 and 6, the display panel 100 may include a substrate 110 and a pixel layer DP. The pixel layer DP may include an active layer 120, a plurality of conductive layers 130, 141, and 142, a plurality of inorganic insulating layers 111 and 112, an organic insulating layer 113, a first electrode 150, a pixel defining layer 114, a light emitting layer 160, a second electrode 170, and an encapsulation layer 180.

The substrate 110 may be a transparent insulating substrate. For example, the substrate 110 may be formed of glass, quartz, plastic, or the like.

The active layer 120 may be disposed on the substrate 110. The conductive layers 130, 141, and 142 may be disposed on the substrate 110 on different layers. The conductive layers 130, 141, and 142 may include a gate electrode 130, a source electrode 141, and a drain electrode 142. The active layer 120 and the conductive layers 130, 141 and 142 may be disposed in the first pixel region PA1, the first peripheral region SA1, the second pixel region PA2, and the second peripheral region SA2.

The inorganic insulating layers 111 and 112, which are disposed on different layers to insulate the active layer 120 and the conductive layers 130, 141 and 142 from each other, may be disposed on the substrate 110. The inorganic insulating layers 111 and 112 may include a gate insulating layer 111 and an interlayer insulating layer 112.

The active layer 120 may be disposed on the substrate 110. The active layer 120 may be formed of amorphous silicon, polycrystalline silicon, oxide semiconductor, or the like. The active layer 120 may include a source region, a drain region, and a channel region disposed between the source region and the drain region. P-type or N-type impurities may be doped in the source region and the drain region, and impurities may not be doped in the channel region.

The gate insulating layer 111 may be disposed on the active layer 120. The gate insulating layer 111 may be formed on the substrate 110 while covering the active layer 120. The gate insulating layer 111 may insulate the gate electrode 130 from the active layer 120. The gate insulating layer 111 may be formed of an inorganic insulating material such as silicon nitride, and silicon oxide, silicon oxynitride.

The gate electrode 130 may be disposed on the gate insulating layer 111. The gate electrode 130 may overlap the channel region of the active layer 120. The gate electrode 130 may be formed of a conductive material such as metal or a metal alloy. For example, the gate electrode 130 may be formed of molybdenum (Mo), copper (Cu), and the like.

An interlayer insulating layer 112 may be disposed on the gate electrode 130. The interlayer insulating layer 112 may be formed on the gate insulating layer 111 while covering the gate electrode 130. The interlayer insulating layer 112 may insulate the source electrode 141 and the drain electrode 142 from the gate electrode 130. The interlayer insulating layer 112 may be formed of an inorganic insulating material such as silicon nitride, and silicon oxide, silicon oxynitride.

The source electrode 141 and the drain electrode 142 may be disposed on the interlayer insulating layer 112. The source electrode 141 may be connected to the source region of the active layer 120, and the drain electrode 142 may be connected to the drain region of the active layer 120. The source electrode 141 and the drain electrode 142 may be formed of a conductive material such as metal or a metal alloy. For example, the source electrode 141 and the drain electrode 142 may be formed of aluminum (Al), titanium (Ti), copper (Cu), or the like. The active layer 120, the gate electrode 130, the source electrode 141, and the drain electrode 142 may form a transistor TR. The transistor TR may be disposed in the first pixel region PA1 and the second pixel region PA2.

The organic insulating layer 113 may be disposed on the source electrode 141 and the drain electrode 142. The organic insulating layer 113 may be formed on the interlayer insulating layer 112 while covering the source electrode 141 and the drain electrode 142. The organic insulating layer 113 may protect the transistor TR and may provide a flat surface onto an upper portion of the transistor TR. The organic insulating layer 113 may be formed of an organic insulating material such as polyimide (PI).

The first electrode 150 may be disposed on the organic insulating layer 113. The first electrode 150 may be connected to the drain electrode 142. The first electrode 150 may be disposed in the first pixel region PA1 and the second pixel region PA2. The first electrode 150 may be formed of a conductive material such as metal or transparent conductive oxide.

The pixel defining layer 114 may be disposed on the first electrode 150. The pixel defining layer 114 may define the first pixel region PA1 and the second pixel region PA2 while including a pixel opening exposing at least a center of the first electrode 150. In addition, the pixel defining layer 114 may separate the second electrode 170 from an edge of the first electrode 150 in a thickness direction, so that an arc or the like may be prevented from occurring between the second electrode 170 and the edge of the first electrode 150. The pixel defining layer 114 may be formed of an organic insulating material such as polyimide (PI).

The light emitting layer 160 may be disposed on the first electrode 150. The light emitting layer 160 may be disposed on the first electrode 150 exposed by the pixel opening. The light emitting layer 160 may include at least one of an organic light emitting material and a quantum dot.

In one embodiment, the organic light emitting material may include a low molecular organic compound or a high molecular organic compound. For example, the low molecular organic compound may include copper phthalocyanine, N,N'-diphenylbenzidine, tris-(8-hydroxyquinoline)aluminum, and the like, and the high molecular organic compound may include poly(3,4-ethylenedioxythiophene, polyaniline, poly-phenylenevinylene, polyfluorene, and the like.

In one embodiment, the quantum dot may include a core including a group II-VI compound, a group III-V compound, a group IV-VI compound, a group IV element, a group IV compound, and a combination thereof. In one embodiment, the quantum dot may have a core-shell structure including a core and a shell surrounding the core. The shell may prevent chemical denaturation of the core, thereby serving as a protective layer for maintaining semiconductor properties and as a charging layer for imparting electrophoretic properties to the quantum dots.

The second electrode 170 may be disposed on the light emitting layer 160. The second electrode 170 may also be disposed on the pixel defining layer 114. The second electrode 170 may face the first electrode 150 with the light emitting layer 160 interposed therebetween. The second electrode 170 may be formed of a conductive material such as metal or transparent conductive oxide. The first electrode 150, the light emitting layer 160, and the second electrode 170 may form a light emitting element EL. The light emitting element EL may be disposed in the first pixel region PA1 and the second pixel region PA2.

The display panel 100 may include a transmission window TW overlapping the transmission region TA. The transmission window TW may be defined as openings of components of the display panel 100 overlapping the transmission region TA. At least one of the gate insulating layer 111, the interlayer insulating layer 112, the organic insulating layer 113, the pixel defining layer 114, and the second electrode 170 may have an opening overlapping the transmission region TA.

In one embodiment, the second electrode 170, the pixel defining layer 114, the organic insulating layer 113, the interlayer insulating layer 112, and the gate insulating layer 111 may have a first opening OP1, a second opening OP2, a third opening OP3, a fourth opening OP4, and a fifth opening OP5 that overlap the transmission region TA, respectively. In this case, the first opening OP1 of the second electrode 170, the second opening OP2 of the pixel defining layer 114, the third opening OP3 of the organic insulating layer 113, the fourth opening OP4 of the interlayer insulating layer 112, and the fifth opening OP5 of the gate insulating layer 111 may form the transmission window TW.

When the insulating layers are laminated in the transmission region TA, the reflectivity of external light reflected at interfaces between adjacent insulating layers may increase. In addition, when the conductive layer is disposed in the transmission region TA, the reflectivity of external light by the conductive layer may increase. However, the display panel 100 according to embodiments of the present inventive concept includes the transmission window TW overlapping the transmission region TA, so that the number of interfaces between adjacent insulating layers in the transmission region TA may decrease, or an area of the conductive layer disposed in the transmission region TA may decrease. Accordingly, the reflectivity of the external light by the interfaces between the adjacent insulating layers or by the conductive layer may decrease.

The encapsulation layer 180 may be disposed on the second electrode 170. The encapsulation layer 180 may include at least one inorganic layer and at least one organic layer.

A part of the encapsulation layer 180 overlapping the first pixel region PA1, the first peripheral region SA1, the second pixel region PA2, and the second peripheral region SA2 may be disposed on the light emitting element EL to block impurities from the outside from being introduced into the light emitting element EL, and protect the light emitting element EL from an external impact. In addition, a part of the encapsulation layer 180 overlapping the transmission region TA may fill the transmission window TW. The encapsulation layer 180 may have a flat top surface throughout the first pixel region PA1, the first peripheral region SA1, the transmissive region TA, the second pixel region PA2, and the second peripheral region SA2.

In one embodiment, the encapsulation layer 180 may include a first inorganic layer, a second inorganic layer disposed on the first inorganic layer, and an organic layer disposed between the first inorganic layer and the second inorganic layer. The first inorganic layer and the second inorganic layer may reduce or substantially block impurities such as oxygen and moisture from permeating into the light emitting element EL. The organic layer may improve sealing properties of the encapsulation layer 180, alleviate internal stresses of the first inorganic layer and the second inorganic layer, compensating for defects in the first inorganic layer and the second inorganic layer, and provide a flat top surface onto the second inorganic layer.

The anti-reflection layer 200 may be disposed on the bottom surface 110L of the substrate 110 corresponding to the first region A1. The anti-reflection layer 200 may overlap the first pixel region PA1 and the first peripheral region SA1 and may not overlap the transmission region TA. When the anti-reflection layer 200 overlaps the first pixel region PA1 and the first peripheral region SA1, the external light incident to the first region A1 may be reduced or substantially prevented from being reflected from the first pixel region PA1 and the first peripheral region SAL In addition, when the anti-reflection layer 200 does not overlap the transmission region TA, the external light passing through the transmission region TA of the first region A1 may be prevented from being blocked by the anti-reflection layer 200.

A sidewall 200S of the anti-reflection layer 200 may be inclined with respect to the substrate 100. For example, the sidewall 200S of the anti-reflection layer 200 may include a sidewall 210S of the first anti-reflection pattern 210 and a sidewall 220S of the second anti-reflection pattern 220, and each of the sidewall 210S of the first anti-reflection pattern 210 and the sidewall 220S of the second anti-reflection pattern 220 may be inclined at an angle smaller than about 90 degrees with respect to the bottom surface 110L of the substrate 100.

In one embodiment, as shown in FIG. 5, the sidewall 220S of the second anti-reflection pattern 220 may come into contact with the sidewall 210S of the first anti-reflection pattern 210. In other words, the sidewall 200S of the anti-reflection layer 200 which includes the sidewall 210S of the first anti-reflection pattern 210 and the sidewall 220S of the second anti-reflection pattern 220 may be disposed on a straight line. For example, a width of a top surface of the second anti-reflection pattern 220 may be substantially the same as a width of a bottom surface of the first anti-reflection pattern 210.

In another embodiment, the sidewall 220S of the second anti-reflection pattern 220 may be spaced apart from the sidewall 210S of the first anti-reflection pattern 210. In other words, the sidewall 200S of the anti-reflection layer 200 may have a stepped structure. For example, the sidewall 220S of the second anti-reflection pattern 220 may protrude or be recessed from the sidewall 210S of the first anti-reflection pattern 210.

In one embodiment, a thickness 210T of the first anti-reflection pattern 210 may be greater than about 1000 Å and less than about 4000 Å. For example, when the first anti-reflection pattern 210 includes molybdenum, the thickness 210T of the first anti-reflection pattern 210 may be about 2500 Å.

In one embodiment, a thickness 220T of the second anti-reflection pattern 220 may be greater than about 100 Å and less than about 1000 Å. When the thickness 220T of the second anti-reflection pattern 220 is less than about 100 Å or greater than about 1000 Å, the reflectivity of the first pixel region PA1 and the first peripheral region SA1 may exceed a predetermined reflectivity (e.g., about 20%), so that the reflection of the external light in the first region A1 may increase.

In one embodiment, the molybdenum oxide included in the second anti-reflection pattern 220 and the oxide of the second metal may have a crystalline structure. The molybdenum oxide and the oxide of the second metal having an amorphous structure may be deposited to form the second anti-reflection pattern 220. The amorphous molybdenum oxide and the amorphous oxide of the second metal may be crystallized during a process of forming the transistor TR that includes a heat treatment process at a temperature of about 300° C. or higher so that the second anti-reflection pattern 220 may include the crystalline molybdenum oxide and the crystalline oxide of the second metal. However, the present inventive concept is not limited thereto. In another embodiment, when the heat treatment process does not proceed, the molybdenum oxide and the oxide of the second metal included in the second anti-reflection pattern 220 may have an amorphous structure.

Hereinafter, a display device according to another embodiment will be described with reference to FIG. 7. In regard to the display device described with reference to FIG. 7, duplicate descriptions for components substantially the same as or similar to the display device described with reference to FIGS. 1 to 6 will be omitted.

Figure 7:
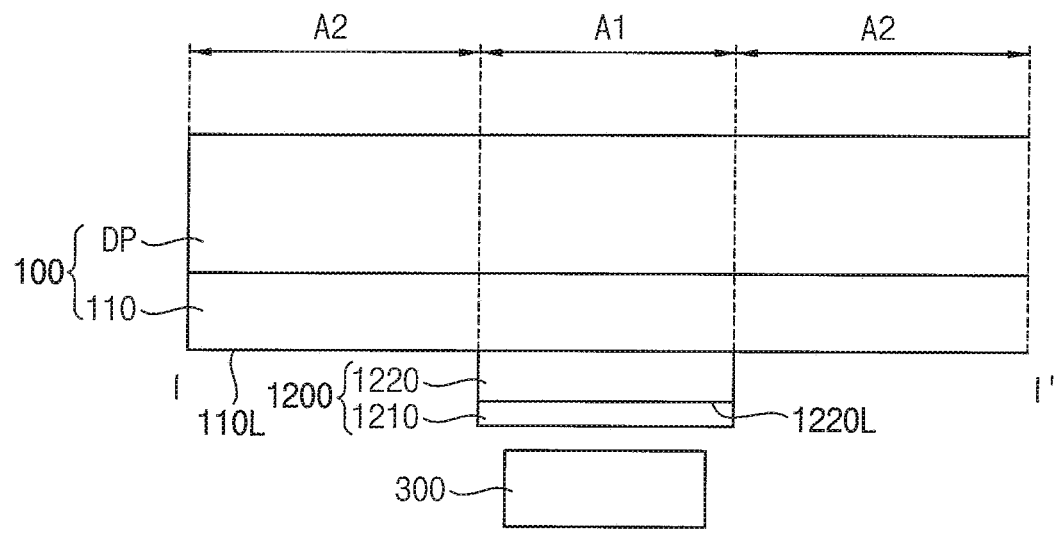
FIG. 7 is a sectional view showing one example taken along line I-I' of FIG. 1.

FIG. 7 is a sectional view showing one example taken along line I-I' of FIG. 1.

Referring to FIG. 7, the display device may include a display panel 100, an anti-reflection layer 1200, and a functional module 300.

The anti-reflection layer 1200 may be disposed on the bottom surface 110L of the substrate 110 corresponding to the first region A1. The anti-reflection layer 1200 may include a first anti-reflection pattern 1210 and a second anti-reflection pattern 1220. The second anti-reflection pattern 1220 may be disposed on the first anti-reflection pattern 1210.

In one embodiment, the second anti-reflection pattern 1220 may be disposed between the substrate 110 and the first anti-reflection pattern 1210. For example, the second anti-reflection pattern 1220 may be disposed on a bottom surface 110L of the substrate 110, and the first anti-reflection pattern 1210 may be disposed on a bottom surface 1220L of the second anti-reflection pattern 1220.

Hereinafter, a display device according to a still another embodiment will be described with reference to FIG. 8. In regard to the display device described with reference to FIG. 8, duplicate descriptions for components substantially the same as or similar to the display device described with reference to FIGS. 1 to 6 will be omitted.

Figure 8:
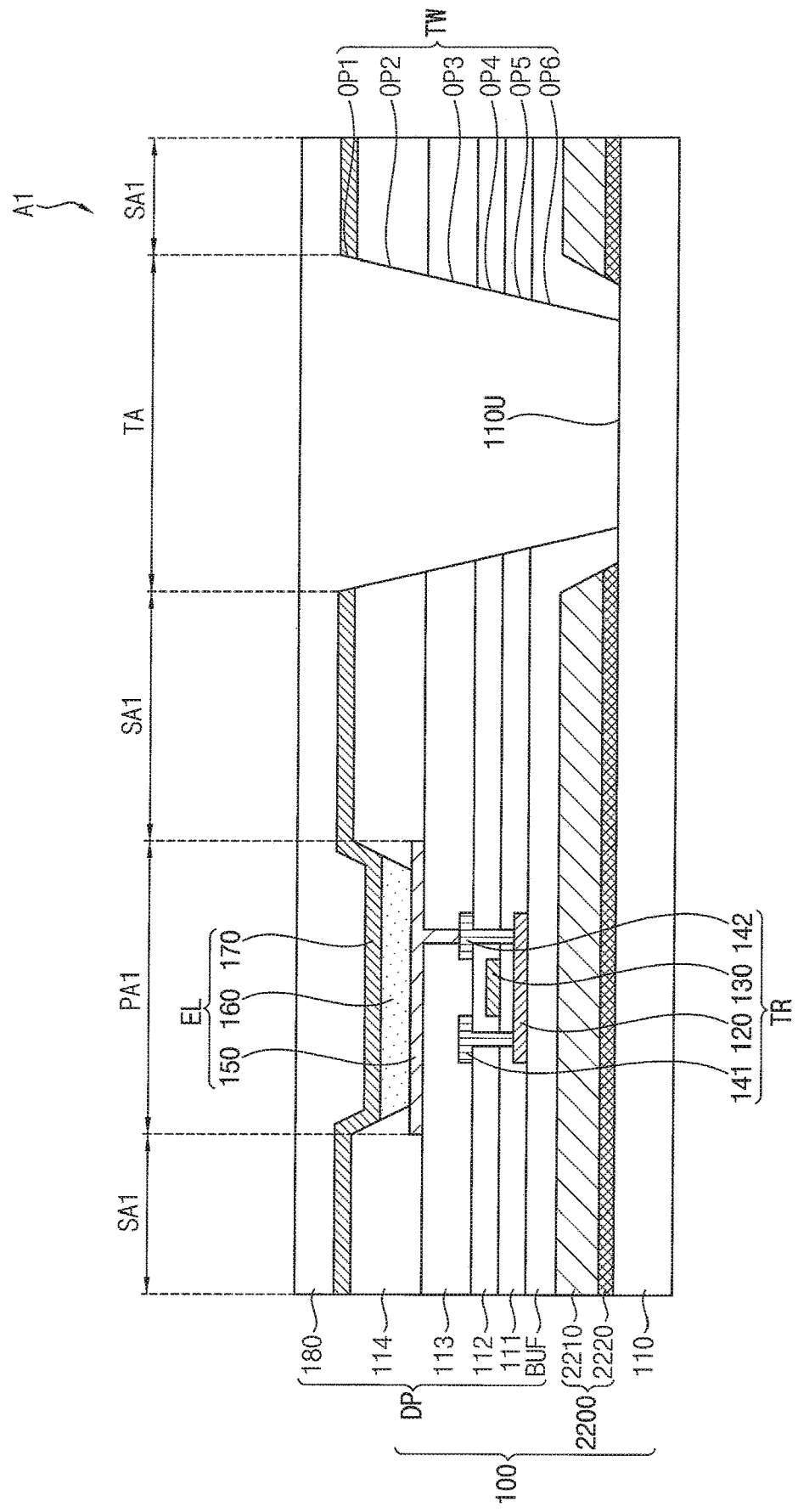
FIG. 8 is a sectional view showing the display device according to one embodiment of the present inventive concept.

FIG. 8 is a sectional view showing the display device according to one embodiment of the present inventive concept. FIG. 8 may show the first region A1 of FIG. 1.

Referring to FIG. 8, the display panel 100 may include a substrate 110 and a pixel layer DP. The pixel layer DP may include a buffer layer BUF, an active layer 120, a plurality of conductive layers 130, 141, and 142, a plurality of inorganic insulating layers 111 and 112, an organic insulating layer 113, a first electrode 150, a pixel defining layer 114, a light emitting layer 160, a second electrode 170, and an encapsulation layer 180.

An anti-reflection layer 2200 may be disposed on a top surface 110U of the substrate 110 corresponding to the first region A1. The anti-reflection layer 2200 may overlap the first pixel region PA1 and the first peripheral region SA1 and may not overlap the transmission region TA. The anti-reflection layer 2200 may include a first anti-reflection pattern 2210 and a second anti-reflection pattern 2220. The second anti-reflection pattern 2220 may be disposed on the first anti-reflection pattern 2210.

In one embodiment, the second anti-reflection pattern 2220 may be disposed between the substrate 110 and the first anti-reflection pattern 2210. For example, the second anti-reflection pattern 2220 may be disposed on the top surface 110U of the substrate 110, and the first anti-reflection pattern 2210 may be disposed on a top surface of the second anti-reflection pattern 2220. However, the present inventive concept is not limited thereto. In another embodiment, the first anti-reflection pattern 2210 may be disposed between the substrate 110 and the second anti-reflection pattern 2220. The first anti-reflection pattern 2210 and the second anti-reflection pattern 2220 may be formed of the same material as the first anti-reflection pattern 210 and the second anti-reflection pattern 220 as described according to FIGS. 1 through 5, respectively.

The buffer layer BUF may be disposed on the anti-reflection layer 2200. The buffer layer BUF may be formed on the substrate 110 while covering the anti-reflection layer 2200. The buffer layer BUF may insulate the active layer 111 from the anti-reflection layer 2200. The buffer layer BUF may be formed of an inorganic insulating material such as silicon nitride, and silicon oxide, silicon oxynitride.

The display panel 100 may include a transmission window TW overlapping the transmission region TA. At least one of the buffer layer BUF, the gate insulating layer 111, the interlayer insulating layer 112, the organic insulating layer 113, the pixel defining layer 114, and the second electrode 170 may have an opening overlapping the transmission region TA.

In one embodiment, the second electrode 170, the pixel defining layer 114, the organic insulating layer 113, the interlayer insulating layer 112, the gate insulating layer 111, the buffer layer BUF may have a first opening OP1, a second opening OP2, a third opening OP3, a fourth opening OP4, a fifth opening OP5, and a sixth opening OP6 that overlap the transmission region TA, respectively. In this case, the first opening OP1 of the second electrode 170, the second opening OP2 of the pixel defining layer 114, the third opening OP3 of the organic insulating layer 113, the fourth opening OP4 of the interlayer insulating layer 112, the fifth opening OP5 of the gate insulating layer 111, and the sixth opening OP6 of the buffer layer BUF may form the transmission window TW.

Hereinafter, a method of manufacturing a display device according to one embodiment will be described with reference to FIGS. 9 to 14.

FIGS. 9, 10, 11, 12, 13, and 14 are sectional views describing the method of manufacturing the display device according to one embodiment of the present inventive concept. For example, FIGS. 9 to 14 may show a method of manufacturing display devices of FIGS. 5 and 6.

Figure 9:
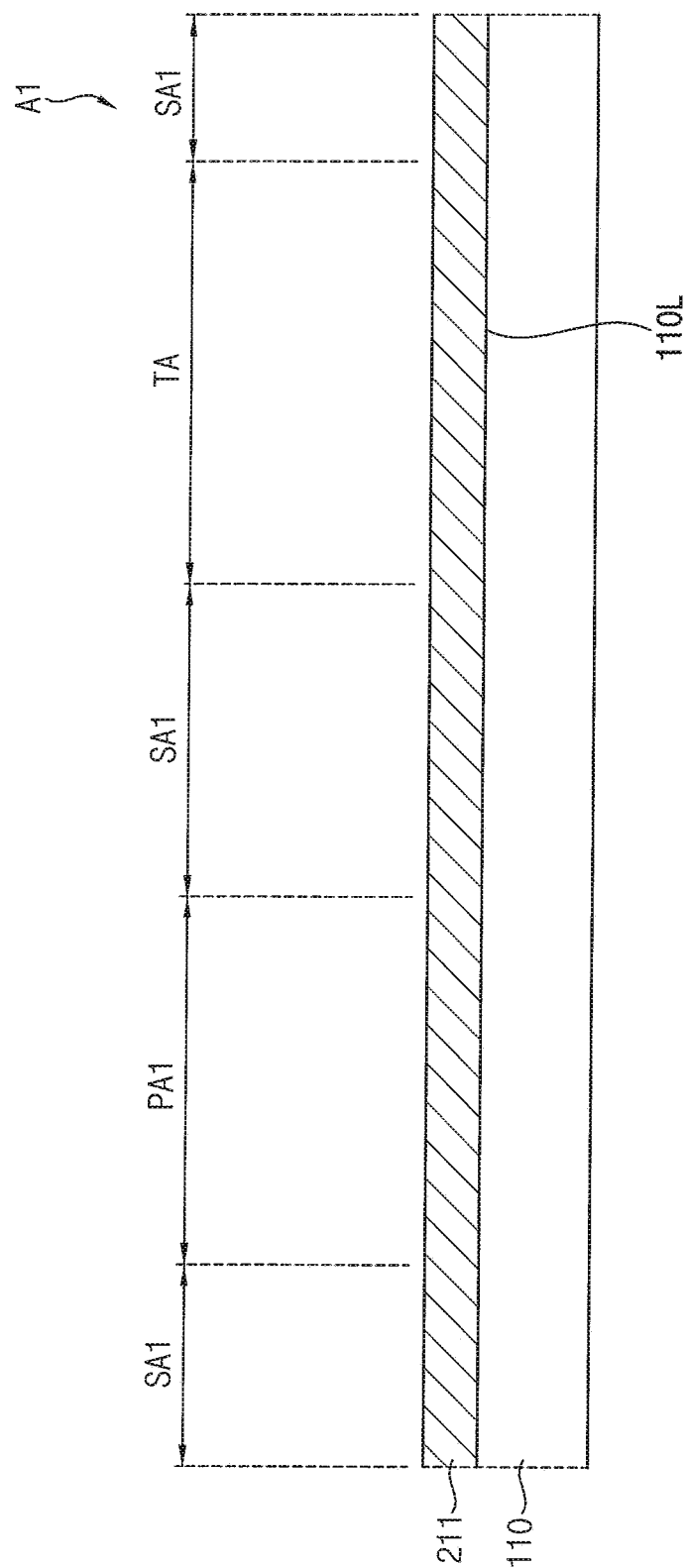
FIGS. 9, 10, 11, 12, 13, and 14 are sectional views describing a method of manufacturing the display device according to one embodiment of the present inventive concept.
Figure 10:
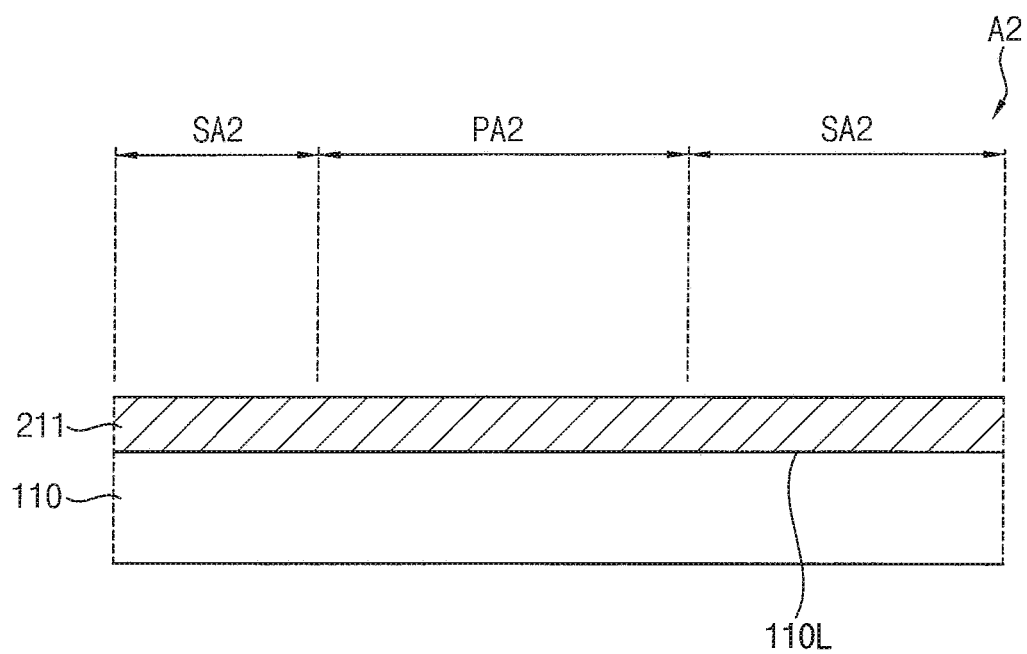

Referring to FIGS. 9 and 10, a first anti-reflection layer 211 including first metal may be formed on the bottom surface 110L of the substrate 110 having the first region A1 and the second region A2. For example, the first anti-reflection layer 211 may be formed on the bottom surface 110L of the substrate 110 by depositing the first metal through sputtering or the like. The first metal may include at least one of molybdenum (Mo), aluminum (Al), and titanium (Ti).

Figure 11:
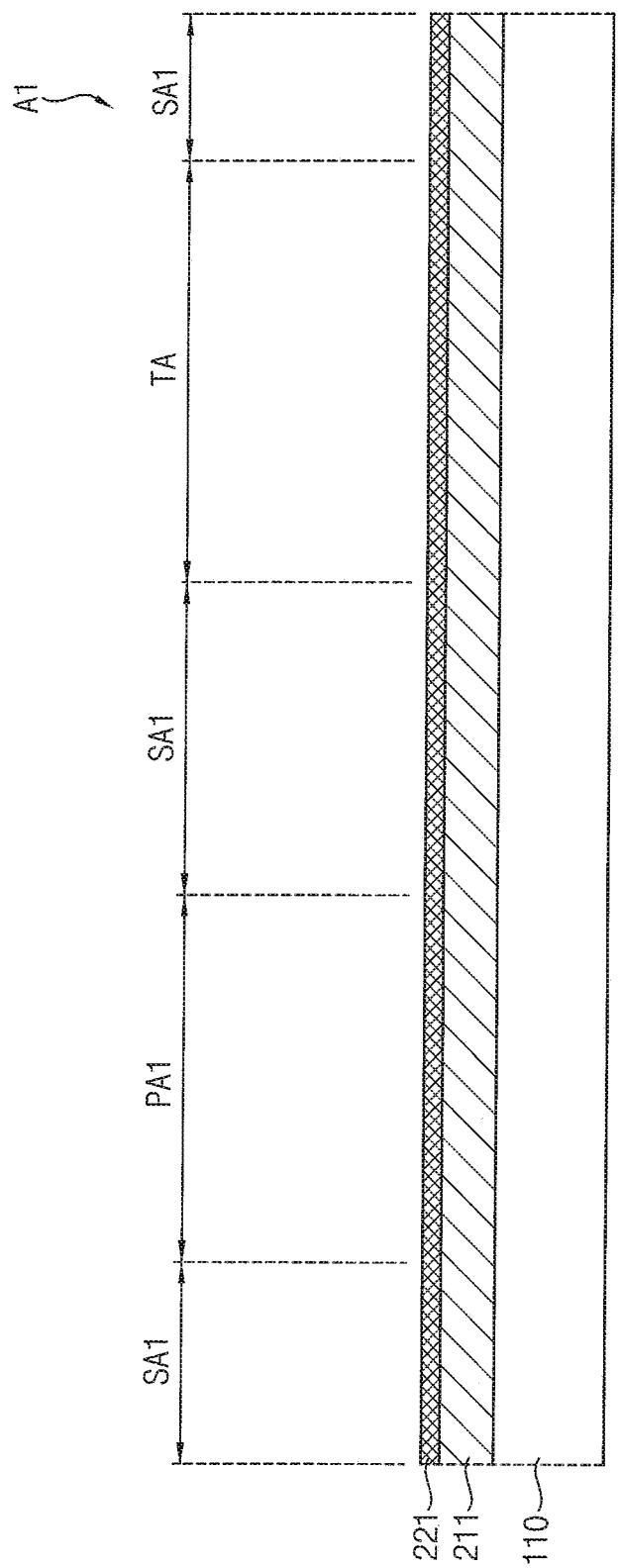
Figure 12:
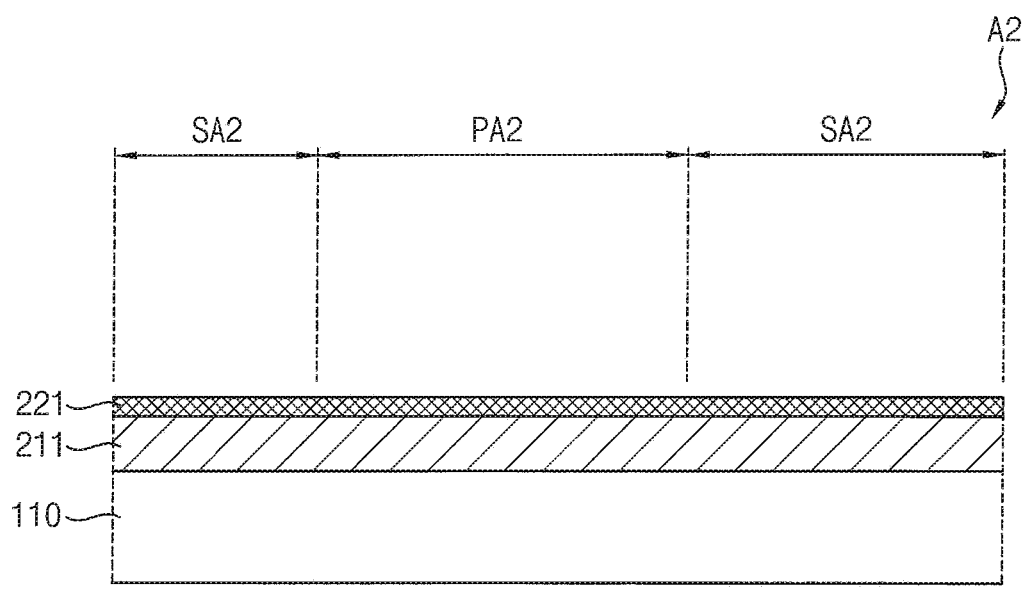

Referring to FIGS. 11 and 12, a second anti-reflection layer 221 including molybdenum oxide ($MoO_x$) and oxide of the second metal other than molybdenum may be formed on the first anti-reflection layer 211. For example, the second anti-reflection layer 221 may be formed by depositing molybdenum oxide on the first anti-reflection layer 211 through sputtering or the like and by adding a small amount of the second metal other than molybdenum as an impurity.

The second metal may include at least one of tantalum (Ta), tungsten (W), niobium (Nb), and copper (Cu).

In one embodiment, after forming the second anti-reflection layer 221 and before etching the first anti-reflection layer 211 and the second anti-reflection layer 221, the substrate 110 on which the first anti-reflection layer 211 and the second anti-reflection layer 221 is disposed may be cleaned using deionized water (DI water). The oxide of the second metal in the second anti-reflection layer 221 may prevent the second anti-reflection layer 221 from being damaged. When the second anti-reflection layer 221 does not include the oxide of the second metal, the molybdenum oxide included in the second anti-reflection layer 221 may be dissolved by the deionized water during the cleaning process so that the second anti-reflection layer 221 may be damaged. However, when the second anti-reflection layer 221 includes the oxide of the second metal, the damage to the second anti-reflection layer 221 during the cleaning process may be prevented.

Figure 13:
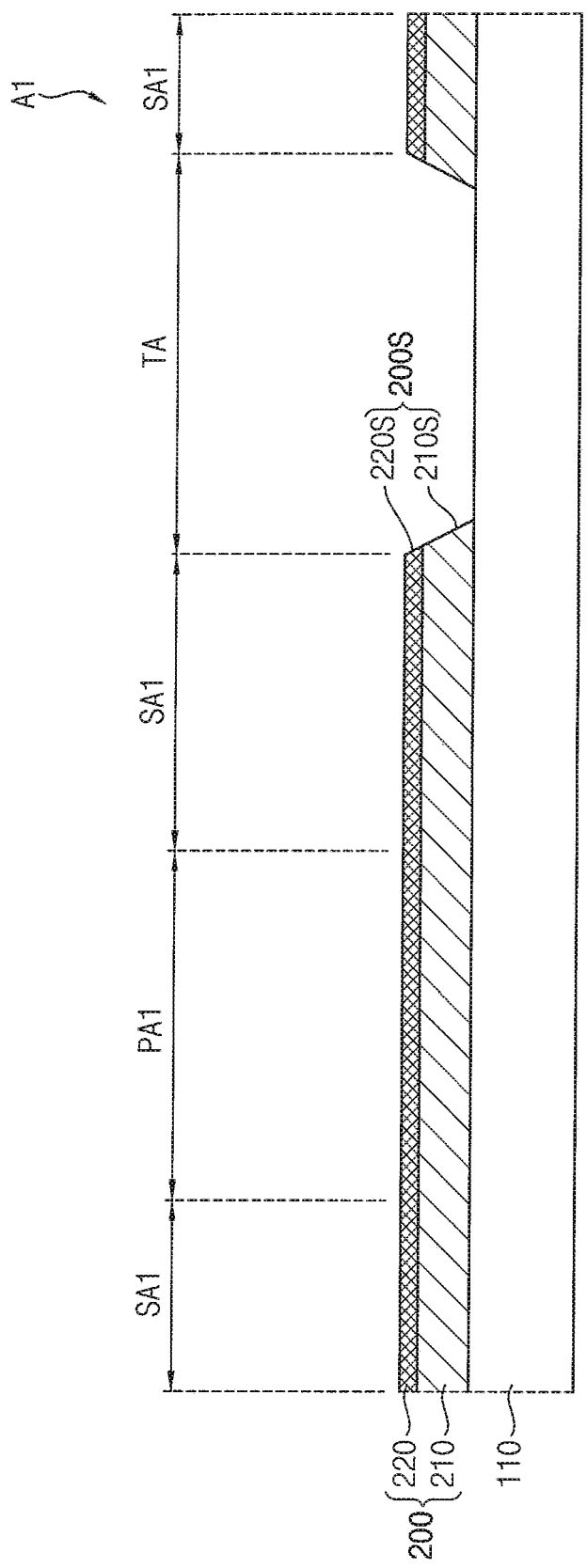
Figure 14:
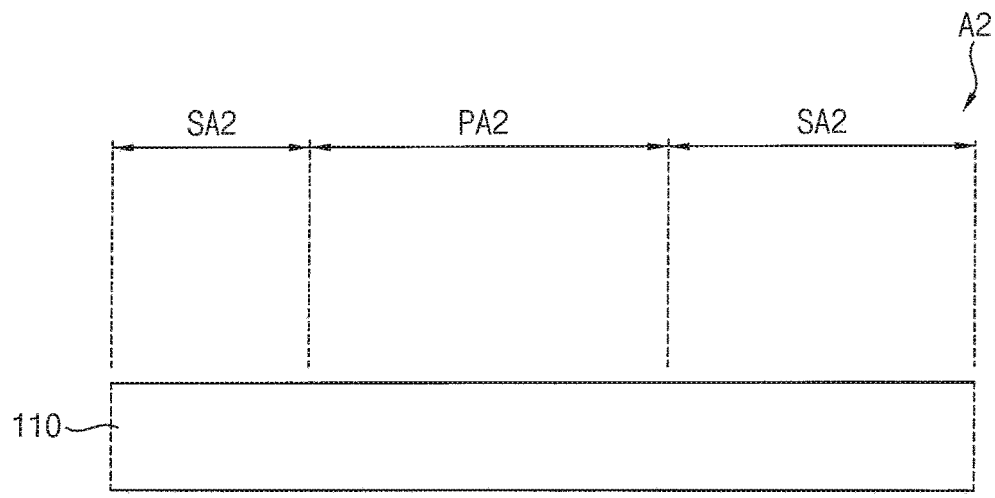

Referring to FIGS. 13 and 14, the first anti-reflection layer 211 and the second anti-reflection layer 221 are etched using a photoresist pattern as a mask so that the anti-reflection layer 200 including the first anti-reflection pattern 210 and the second anti-reflection pattern 220 may be formed corresponding to the first region A1. For example, the photoresist pattern overlapping the first pixel region PA1 and the first peripheral region SA1 may be formed on the second anti-reflection layer 221, and the second anti-reflection layer 221 and the first anti-reflection layer 211 may be sequentially etched using the photoresist pattern as an etching mask so that the anti-reflection layer 200 overlapping the first pixel region PA1 and the first peripheral region SA1 may be formed. In the etching process, parts of the first anti-reflection layer 211 and the second anti-reflection layer 221 overlapping the second region A2 and the transmission region TA of the first area A1 may be removed.

In one embodiment, the first anti-reflection layer 211 and the second anti-reflection layer 221 may be etched through a dry etching. Since the anti-reflection layer 200 is formed to overlap the first pixel region PA1 and the first peripheral region SA1 of the first region A1, and not to overlap the transmission region TA of the first region A1 and the second region A2, the anti-reflection layer 200 may not be formed by attaching a film having openings in areas corresponding to the transmission region TA of the first region A1 and the second region A2 on the substrate 110.

In a comparative example in which the second anti-reflection layer 221 includes an organic material, since the first anti-reflection layer 211 and the second anti-reflection layer 221 have different etching properties, two separate etching processes (a first etching process for etching the second anti-reflection layer 221 and a second etching process for etching the first anti-reflection layer 211) may be required. In addition, since the second anti-reflection layer 221 includes an organic material, it may be difficult to form the second anti-reflection pattern 220 having a relatively small width.

However, according to one embodiment of the present inventive concept, because the first anti-reflection layer 211 and the second anti-reflection layer 221 are etched through a single dry etching process using one mask, the anti-reflection layer 200 corresponding to the first region A1 having a relatively small area may be formed through the single etching process. Accordingly, the cost and time for forming the anti-reflection layer 200 can be reduced.

Hereinafter, experimental examples will be described in which the reflectivity of metal coated with the anti-reflection material of the second anti-reflection pattern of the present inventive concept is measured.

Experimental Example 1

Molybdenum may be coated with metal oxide including molybdenum oxide ($MoO_x$) and tantalum oxide ($TaO_y$) and having a thickness of about 400 Å to about 650 Å. Then, the average reflectivity of the coating structure with respect to visible light and the reflectivity of the coating structure with respect to light having 550 nm wavelength were simulated using a software tool, wherein x is the composition ratio of oxygen atoms to molybdenum atoms, y is the composition ratio of oxygen atoms to tantalum atoms, and x and y may be stoichiometrically set as proper values. For example, the composition ratio of tantalum atoms to molybdenum atoms may be set in the range of about 2% to about 6%.

Figure 15:
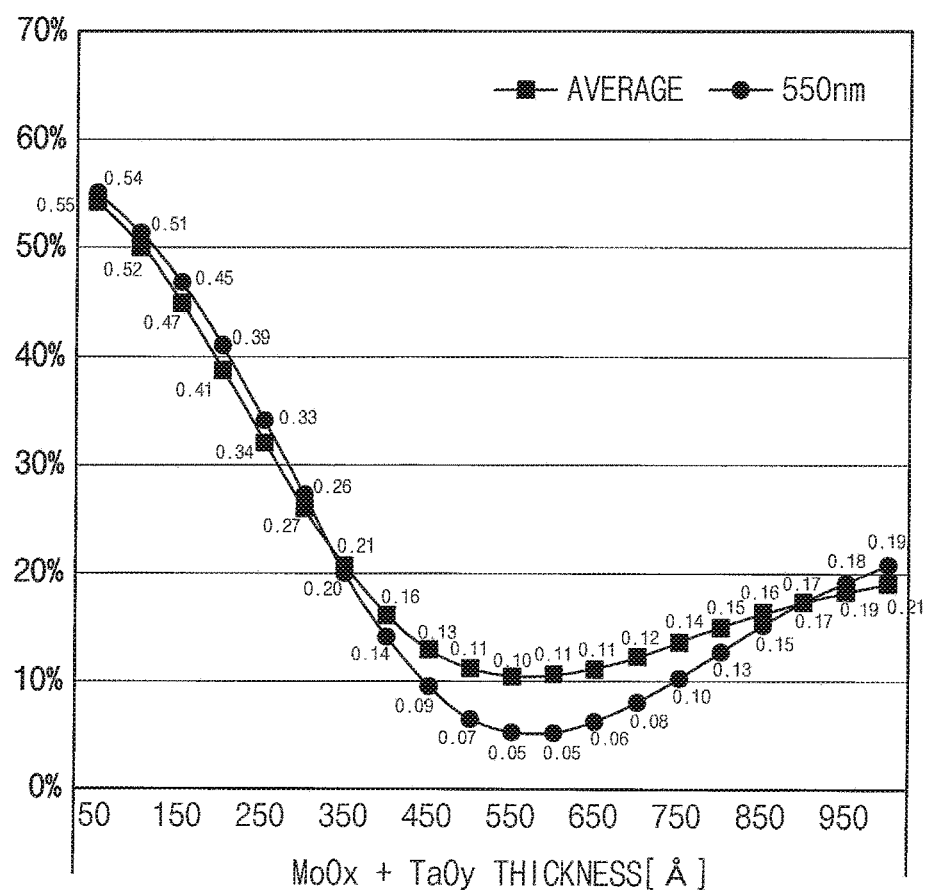
FIG. 15 is a graph showing a reflectivity simulation result.

FIG. 15 is a graph showing a reflectivity simulation result.

Referring to FIG. 15, it can be seen that the optimal reflectivity reduction effect is exhibited when the thickness of the metal oxide is in the range of about 450 Å to about 750 Å. When the configuration is applied to the display device, a reflectivity reduction effect may be added due to a refractive index matching layer or the like, and accordingly, the reflectivity of less than about 10% may be expected with respect to the light having wavelength of 550 Å.

Experimental Example 2

A molybdenum layer having a thickness of about 2500 Å may be coated with the metal oxide of Experimental Example 1 having a thickness of about 350 Å to about 750 Å. Then, the average reflectivity of the coating structure with respect to the visible light and the reflectivity of the coating structure with respect to the light having 550 nm wavelength may be measured. In metal oxide having the above composition formula, a composition of each element may be analyzed by using energy dispersive X-ray spectroscopy (EDS), x-ray photoelectron spectroscopy (XPS), secondary ion mass spectroscopy (SIMS), auger electron spectroscopy (AES), or the like.

Figure 16:
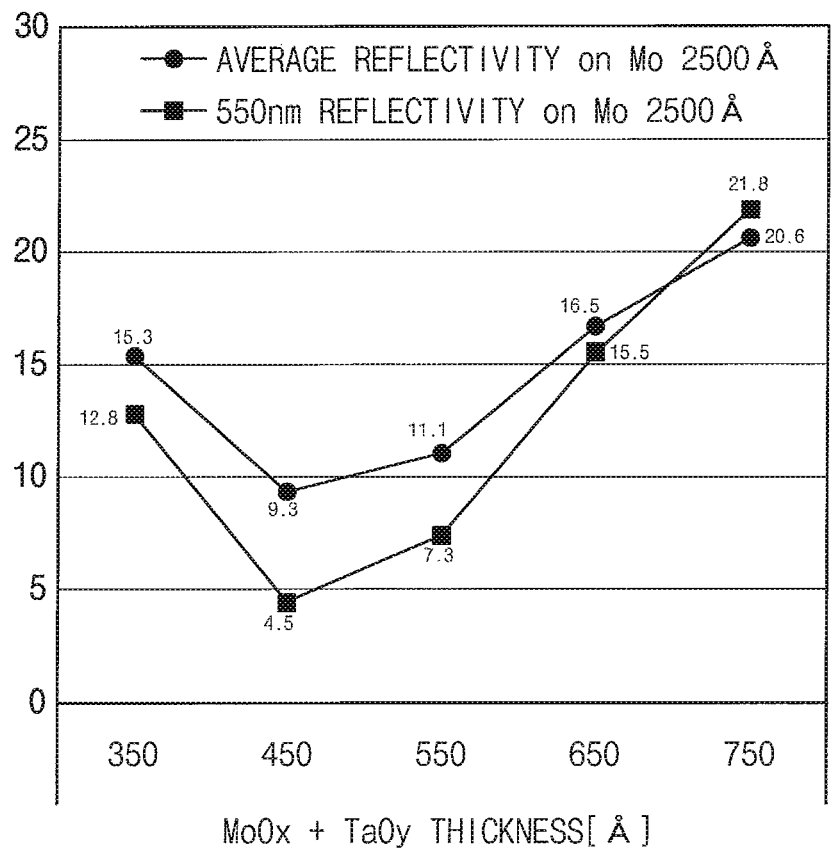
FIG. 16 is a graph showing a reflectivity measurement result.

FIG. 16 is a graph showing a reflectivity measurement result.

Referring to FIG. 16, it can be seen that the optimal reflectivity reduction effect is exhibited when the thickness of the metal oxide is in the range of about 350 Å to about 600 Å. In addition, it can be seen that the change in reflectivity according to the thickness is similar to the simulation result.

Experimental Example 3

The metal oxide of Experimental Example 1 may be coated on each of a molybdenum layer, an aluminum layer, and a titanium/aluminum/titanium multilayer to have a thickness of about 450 Å. Then, each reflectivity of coating structures may be measured according to a wavelength.

Figure 17:
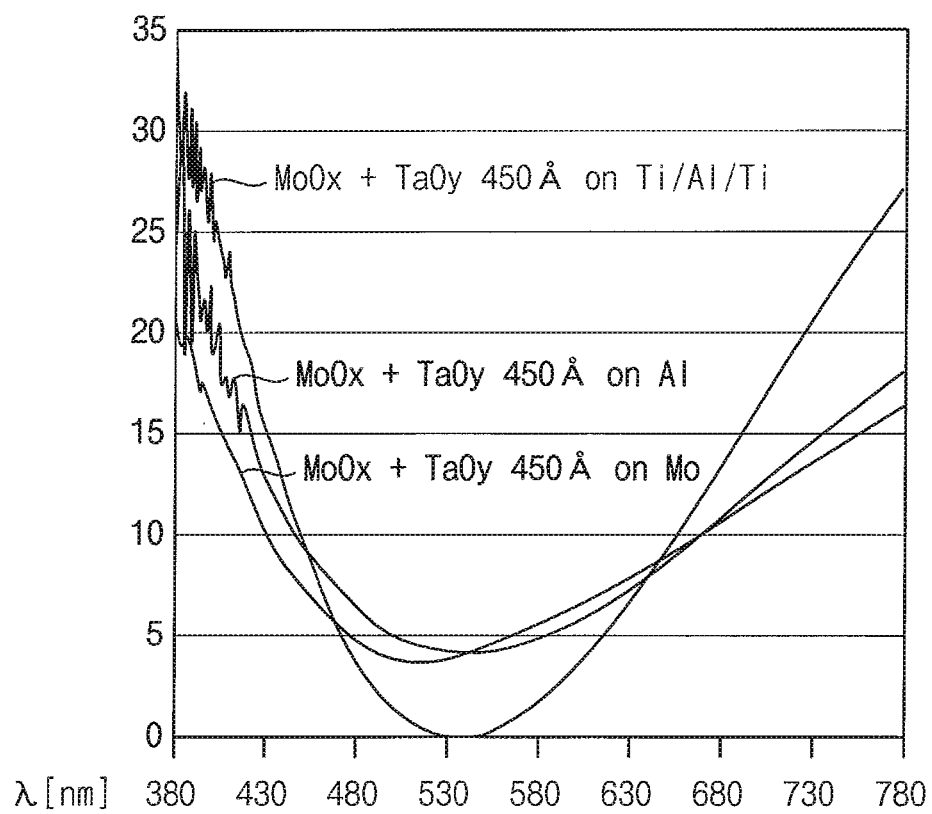
FIG. 17 is a graph showing a reflectivity measurement result.

FIG. 17 is a graph showing a reflectivity measurement result.

Referring to FIG. 17, when the metal oxide is coated, the reflectivity reduction effect may increase as a wavelength of light approaches about 550 nm which is the most sensitive wavelength to a human eye.

Hereinafter, a method of manufacturing a display device according to one embodiment will be described with reference to FIGS. 18 to 20.

Figure 18:
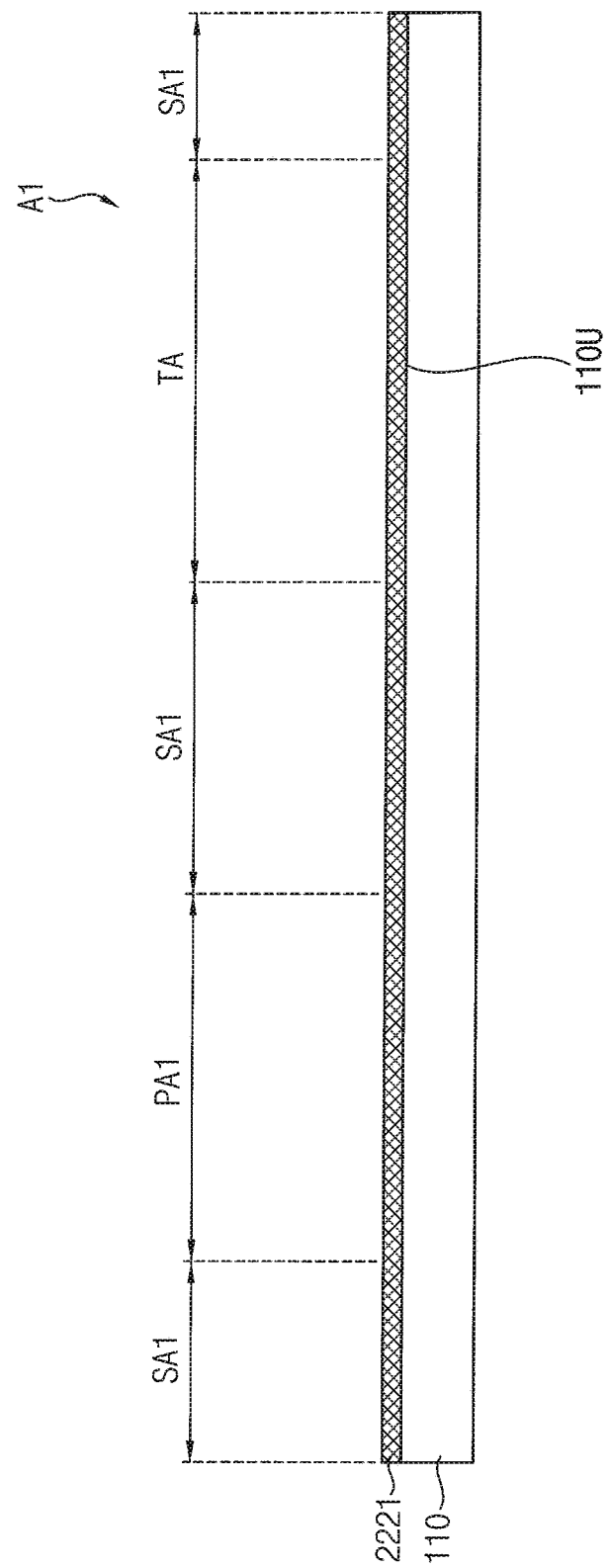
FIGS. 18, 19 and 20 are sectional views describing a method of manufacturing the display device according to one embodiment of the present inventive concept.
Figure 19:
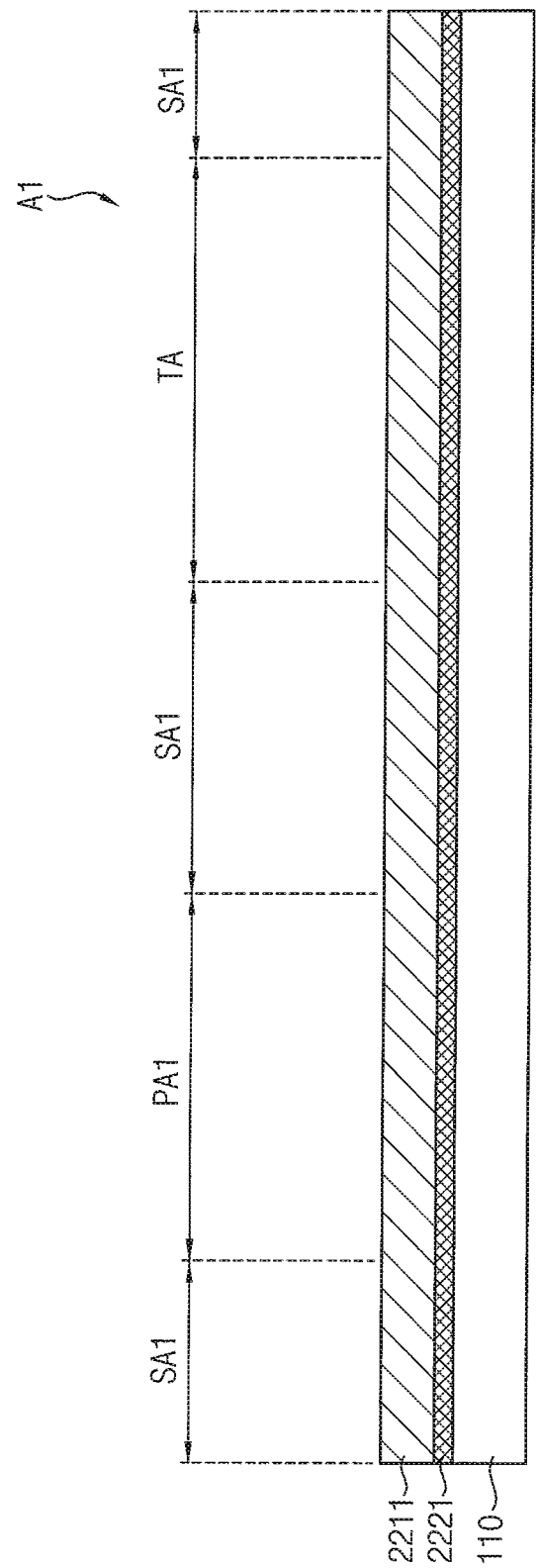
Figure 20:
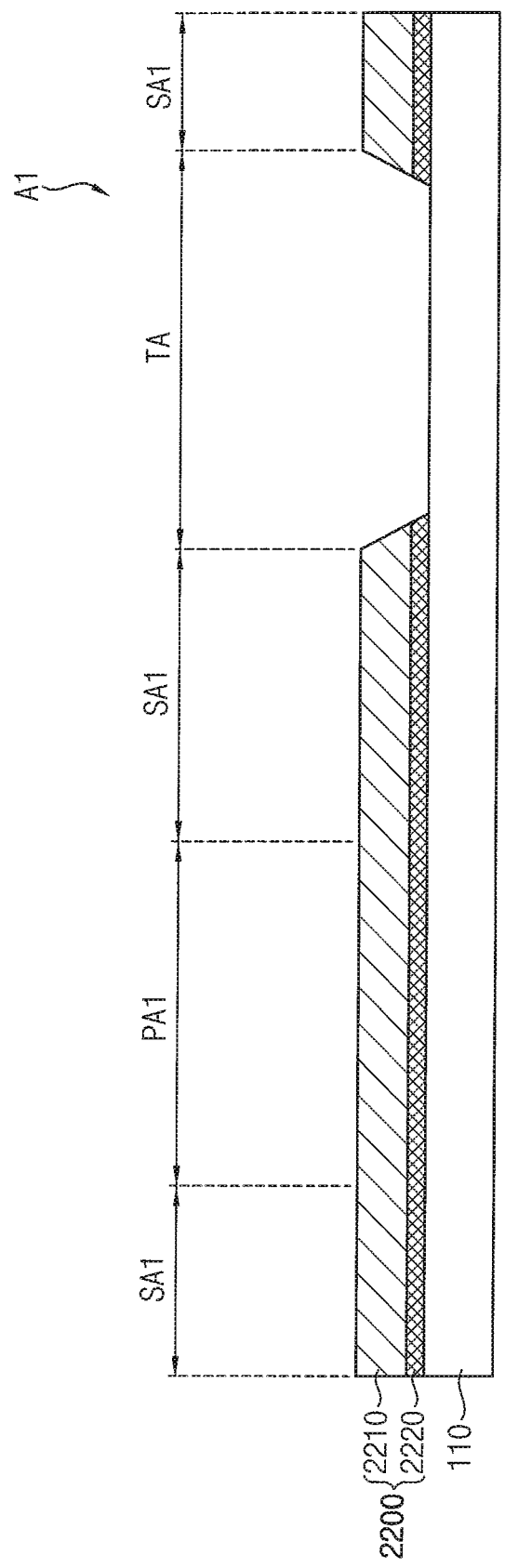

FIGS. 18, 19 and 20 are sectional views describing the method of manufacturing the display device according to one embodiment of the present inventive concept. For example, FIGS. 18 to 20 may show a method of manufacturing the display device of FIG. 8.

Referring to FIG. 18, a second anti-reflection layer 2221 including molybdenum oxide (MoO$_x$) and oxide of the second metal other than molybdenum may be formed on the top surface 110U of the substrate 110 having the first region A1 and the second region. For example, the second anti-reflection layer 2221 may be formed by depositing molybdenum oxide on the top surface 110U of the substrate 110 through sputtering or the like and by adding a small amount of the second metal as an impurity.

Referring to FIG. 19, the first anti-reflection layer 2211 including the first metal may be formed on the second anti-reflection layer 2221. For example, the first anti-reflection layer 2211 may be formed by depositing the first metal on the second anti-reflection layer 2221 through sputtering or the like.

In one embodiment, after forming the first anti-reflection layer 2211 and before etching the second anti-reflection layer 2221 and the first anti-reflection layer 2211, the substrate 110 including the second anti-reflection layer 2221 and the first anti-reflection layer 2211 may be cleaned using deionized water (DI water).

Referring to FIG. 20, the first anti-reflection layer 2211 and the second anti-reflection layer 2221 are etched through a single dry etching process using one mask to form the second anti-reflection pattern 2220 and the first anti-reflection pattern 2210 in areas corresponding to the first region A1 may be formed. In the etching process, parts of the second anti-reflection layer 2221 and the first anti-reflection layer 2211 overlapping the second region A2 and the transmission region TA of the first area A1 may be removed. In one embodiment, the second anti-reflection layer 2221 and the first anti-reflection layer 2211 may be etched through a dry etching.

The display device according to the embodiments may be applied to a display device included in a computer, a notebook, a mobile phone, a smartphone, a smart pad, a PMP, a PDA, an MP3 player, or the like.

Although the display devices and methods of manufacturing the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
a display panel having a first region and a second region having a transmittance lower than a transmittance of the first region, the display panel including a substrate and a pixel layer disposed on one side of the substrate, the pixel layer including a first electrode, a second electrode, and a light emitting layer disposed between the first electrode and the second electrode;
an anti-reflection layer disposed on the other side of the substrate which opposes the one side of the substrate in an area corresponding to the first region not to overlap the second region; and
a functional module disposed under the display panel in an area corresponding to the first region not to overlap the second region,
wherein the anti-reflection layer includes:
a first anti-reflection pattern including first metal; and
a second anti-reflection pattern disposed on the first anti-reflection pattern and including molybdenum oxide (MoOx) and oxide of a second metal other than molybdenum, and
wherein the functional module includes one of a camera module, a face recognition sensor module, a pupil recognition sensor module, an acceleration sensor module, a geomagnetic sensor module, a proximity sensor module, an infrared sensor module and an illuminance sensor module.

2. The display device of claim 1, wherein the anti-reflection layer overlaps the first region and does not overlap the second region.

3. The display device of claim 1, wherein the first metal includes at least one of molybdenum (Mo), aluminum (Al), and titanium (Ti).

4. The display device of claim 1, wherein the second metal includes at least one of tantalum (Ta), tungsten (W), niobium (Nb), and copper (Cu).

5. The display device of claim 1, wherein a ratio of the second metal to molybdenum in the second anti-reflection pattern is greater than 0 atomic percent (at. %) and less than about 20 atomic percent (at. %).

6. The display device of claim 1, wherein the molybdenum oxide included in the second anti-reflection pattern and the oxide of the second metal have a crystalline structure.

7. The display device of claim 1, wherein the first anti-reflection pattern is disposed between the substrate and the second anti-reflection pattern.

8. The display device of claim 1, wherein the anti-reflection layer is disposed on a top surface of the substrate, and the second anti-reflection pattern is disposed between the substrate and the first anti-reflection pattern.

9. The display device of claim 1, wherein the second anti-reflection pattern has a thickness greater than about 100 Å and smaller than about 1000 Å.

10. The display device of claim 1, wherein a side-wall of the anti-reflection layer is inclined with respect to the substrate.

11. The display device of claim 1, wherein the second anti-reflection pattern has a reflectivity less than a reflectivity of the first anti-reflection pattern.

12. The display device of claim 1, wherein the first region include a first pixel region, a transmission region, and a first peripheral region surrounding the first pixel region and the transmission region.

13. The display device of claim 12, wherein the anti-reflection lay overlaps the first pixel region and the first peripheral region and does not overlap the transmission region.

14. The display device of claim 12, wherein the second region includes a second pixel region and a second peripheral region surrounding the second pixel region.

15. The display device of claim 1, wherein the second region surrounds at least a part of the first region.

* * * * *